(12) United States Patent
Onda et al.

(10) Patent No.: US 7,629,644 B2
(45) Date of Patent: Dec. 8, 2009

(54) INSULATED GATE-TYPE SEMICONDUCTOR DEVICE AND MANUFACTURING METHOD OF THE SAME

(75) Inventors: Masahito Onda, Gunma (JP); Hirotoshi Kubo, Gunma (JP); Shouji Miyahara, Gunma (JP); Hiroyasu Ishida, Gunma (JP); Hiroaki Saito, Gunma (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 271 days.

(21) Appl. No.: 11/023,961

(22) Filed: Dec. 29, 2004

(65) Prior Publication Data

US 2005/0167748 A1    Aug. 4, 2005

(30) Foreign Application Priority Data

Jan. 21, 2004    (JP) .............................. 2004-013426

(51) Int. Cl.
*H01L 29/76*    (2006.01)

(52) U.S. Cl. .................. 257/330; 438/270; 257/E29.26

(58) Field of Classification Search ......... 257/329–331, 257/E29.26, E29.257, E29.201, E29.262, 257/341, 342; 438/270, 589
See application file for complete search history.

(56) References Cited

U.S. PATENT DOCUMENTS

| 4,767,722 | A | 8/1988 | Blanchard |
| 5,034,785 | A | 7/1991 | Blanchard |
| 6,518,128 | B2 * | 2/2003 | Hshieh et al. ................ 438/270 |
| 6,737,704 | B1 * | 5/2004 | Takemori et al. ............ 257/329 |
| 2002/0009854 | A1 | 1/2002 | Hshieh et al. |
| 2004/0041207 | A1 * | 3/2004 | Takano et al. ................ 257/330 |
| 2004/0173844 | A1 * | 9/2004 | Williams et al. ............. 257/329 |

FOREIGN PATENT DOCUMENTS

| CN | 1436371 | 8/2003 |
| JP | 2662217 | 6/1997 |
| JP | 2001-274396 | 10/2001 |
| JP | 2001-2774396 | 10/2001 |
| JP | 2003-101027 | 4/2003 |

OTHER PUBLICATIONS

Chinese Office Action dated Jun. 22, 2007, directed to counterpart CN application No. 2004101037160 (2 pages).

* cited by examiner

*Primary Examiner*—David Vu
(74) *Attorney, Agent, or Firm*—Morrison & Foerster LLP

(57) ABSTRACT

An interlayer dielectric film is completely buried in a trench, and failures caused by step coverage is prevented because a source electrode can be formed substantially uniformly on an upper portion of a gate electrode. Also, in the processes of forming a source region, a body region and an interlayer dielectric film, only one mask is necessary so that the device size is reduced to account for placement error of only one mask alignment.

7 Claims, 9 Drawing Sheets

Prior Art

Prior Art

Prior Art

INSULATED GATE-TYPE SEMICONDUCTOR DEVICE AND MANUFACTURING METHOD OF THE SAME

BACKGROUND OF THE INVENTION

1. Field of the Invention

The invention relates to an insulated gate-type semiconductor device and a method of manufacturing the same, specifically to an insulated gate-type semiconductor device with improved step coverage of a source electrode and a manufacturing method thereof.

With insulated gate-type semiconductor devices like a MOSFET, the cell density is improved to achieve a low on resistance by using a trench structure.

2. Description of the Related Art

FIG. 9 shows an example of an N-channel type power MOSFET structure with a conventional trench structure. A drain region 21b is provided, for instance by laminating an $N^-$-type epitaxial layer on an $N^+$-type silicon semiconductor substrate 21a. A P-type channel layer 24 is formed on a surface of the drain region 21b. A trench 27 is provided which penetrates the channel layer 24 to reach the drain region 21b and inner walls thereof are covered with a gate oxide film 31. Further, the trench 27 is filled with polysilicon, for instance, to form a gate electrode 33.

An $N^+$-type source region 35 is formed on a surface of the channel layer 24 adjacent the trench 27 and a $P^+$-type body region 34 is provided on a surface of the channel layer 24 between adjacent source regions 35 of two cells. A channel region (not illustrated) is formed in the channel layer 24, from the source region 35 and along the trench 27. The gate electrode 33 is covered with an interlayer dielectric film 36 and a source electrode 37 is provided which is in contact with the source region 35 and the body region 34.

FIGS. 10 through 14 show a manufacturing method of a power MOSFET having a conventional trench structure.

As shown in FIG. 10, a semiconductor substrate 21 is prepared by laminating an $N^-$-type epitaxial layer 21b forming a drain region on an $N^+$-type silicon semiconductor substrate 21a. After boron is doped and diffused in a surface of the substrate 21, a P-type channel layer 24 having a thickness of about 1.5 μm is formed.

Then, a trench 27 having a depth of around 2.0 μm is formed by anisotropically dry etching the substrate 21 with a CF and an HBr group gas while using a CVD oxide film as a mask (not shown here) and penetrating the channel layer 24 to reach the drain region 21b. The entire surface is subjected to thermal oxidation and a gate oxide layer 31 of around 700 Å is formed on inner walls of the trench 27.

A gate electrode 33 filling the trench 27 is formed as shown in FIG. 11 by depositing a non-doped polysilicon layer (not shown) to the entire surface, implanting and diffusing high-concentration impurities to obtain a high specific conductivity. Next, the polysilicon layer deposited to the entire surface is dry etched without using a mask, leaving the gate electrode 33 filled in the trench 27.

In FIG. 12, boron is selectively ion implanted in doses of around $5.0 \times 10^{14}$ cm$^{-2}$ using a mask formed of a resist film (not shown here) to remove the resist film. After under going a process of annealing, a $P^+$-type body region 34 is formed.

As in FIG. 13, a mask is provided on the surface so that the source region 35 to be formed later and the gate electrode 33 are exposed and the arsenic (As) is implanted in doses of $5.0 \times 10^{15}$ cm$^{-2}$ then the resist film is removed. After undergoing a process of annealing, an $N^+$-type source region 35 is formed on a surface of the channel layer 24 adjacent the trench 27.

After a TEOS (Tetra Ethyl Ortho Silicate) film (not shown) of about 2000 Å is provided on the entire surface as illustrated in FIG. 14, a BPSG (Boron Phosphorus Silicate Glass) layer of about 6000 Å is deposited by the CVD method. A resist layer PR is masked so that it is left at least on the gate electrode 33 to thus form an interlayer dielectric film 36 and the resist layer PR is removed. In the next step, aluminum is sputtered to the entire surface in a sputtering apparatus to form a source electrode 37 which contacts the source region 35 and the body region 34 (Refer to FIG. 9). This technology is described for instance in Japanese Patent Application Publication No. 2001-274396.

The above conventional device comprises an interlayer dielectric film 36 for insulating the gate electrode 33 and the source electrode 37. Because the interlayer dielectric film 36 may have a thickness of about 8000 Å, the step coverage of the source electrode 37 formed by sputtering deteriorates and a void 50 as shown in FIG. 15 may be formed. The void 50 causes an increase in the wiring resistance and becomes a characteristic deteriorating factor. Also, stresses are applied to the corner of the interlayer dielectric film 36 at the time of the source electrode 37 wire bonding and molding and cracks 51 may occur starting from the interlayer dielectric film 36 to the silicon substrate 21.

Also, the problem occurring in the conventional process is that when a predetermined body region is not secured, the avalanche resistance and parasitic operation between the body region 34 and the source region 35 deteriorate. Moreover, because of placement error of mask to form the interlayer dielectric film 36 that prevents short circuit between the gate electrode 33 and the source electrode 37, the interlayer dielectric film 36 is formed to have a larger size than the width of the trench 27.

On the one hand, as the miniaturization of device advances, the area of the source region 35 is further reduced and so is the contact area between the source region 35 and the source electrode 37.

Conventionally, one mask is used in the formation of each of the source region 35, body region 34 and interlayer dielectric film 36. Accordingly, because of the placement errors of the masks to form the interlayer dielectric film 36, the body region 34 and the source regions 35, the sufficient contact area between the source region 35 and the source electrode 37 cannot be secured, thus causing an increase in the wiring resistance of the source electrode.

SUMMARY OF THE INVENTION

The invention provides an insulated gate type semiconductor device that includes a semiconductor substrate of a first conductivity type having a drain region, a channel layer of a second conductivity type formed on a surface of the drain region, a trench penetrating the channel layer to reach the drain region, a gate insulating film formed on an inner wall of the trench, a source region of the first conductivity type provided adjacent the trench, a gate electrode disposed in the trench, and an interlayer dielectric film disposed in the trench so as to be on top of the gate electrode. The interlayer dielectric film is thinner at a center portion thereof than at a peripheral portion thereof, and a source electrode is disposed over the trench.

The invention also provides a method of manufacturing an insulated gate type semiconductor device. The method includes forming on a surface of a semiconductor substrate of a first conductivity type a channel layer of a second conductivity type, forming a trench penetrating the channel layer, providing a gate insulating film on an inner wall of the trench, forming a gate electrode in the trench so that a top surface of the gate electrode is positioned below a top of the trench, forming an interlayer dielectric film in the trench and on the top surface of the gate electrode so that the interlayer dielectric film is thinner at a center portion thereof than at a peripheral portion thereof, forming a source region of the first conductivity type adjacent the trench, forming a body region of the second conductivity type disposed between the source region and another source region, and forming a source electrode over the trench.

The invention further provides a method of manufacturing an insulated gate type semiconductor device. The method includes forming on a surface of a semiconductor substrate of a first conductivity type a channel layer of a second conductivity type, forming a first trench and a second trench each penetrating the channel layer, providing a gate insulating film on an inner wall of each of the trenches, forming a gate electrode in each of the trenches so that a top surface of the gate electrode is positioned below a top of a corresponding trench, forming an interlayer dielectric film in each of the trenches and on the top surface of a corresponding gate electrode so that the interlayer dielectric film is thinner at a center portion thereof than at a peripheral portion thereof, implanting impurities of the first conductivity type into an entire surface of the channel layer, forming a recess dividing the impurity-implanted surface of the channel layer between the first and second trenches, forming a source region of the first conductivity type adjacent each of the trenches, forming a body region of the second conductivity type under the recess, and forming a source electrode over the first and second trenches.

BRIEF DESCRIPTION OF THE INVENTION

DETAILED DESCRIPTION OF THE INVENTION

An embodiment of the invention is described with reference to FIG. 1 through FIG. 8B, using an N-channel trench-type Power MOSFET.

Figure 1:
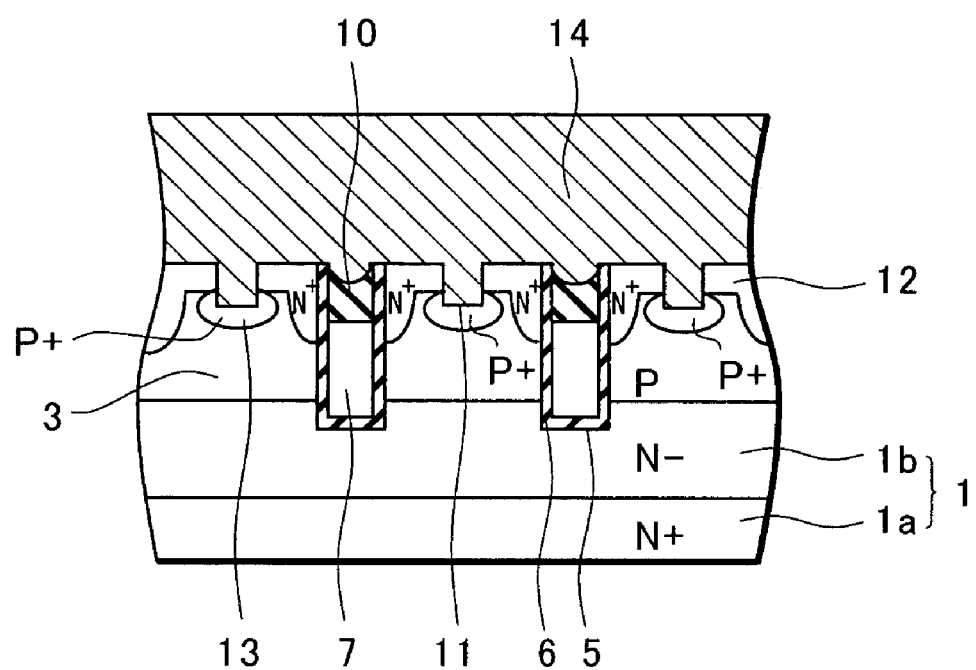
FIG. 1 is a cross sectional view showing an insulated gate type semiconductor device according to an embodiment of the invention.

FIG. 1 shows a cross-sectional view of the MOSFET. The MOSFET includes a semiconductor substrate 1, a channel layer 3, a trench 5, a gate insulating film 6, a gate electrode 7, a source region 12, a body region 13, an interlayer dielectric film 10 and a source electrode 14.

The semiconductor substrate includes an $N^+$-type silicon semiconductor substrate 1a and an $N^-$-type epitaxial layer 1b laminated thereon which forms a drain region. A channel layer 3 which is an opposite conductivity type impurity region is provided on a surface of the drain region 1b.

A trench 5 is formed so as to penetrate the channel layer 3 and to reach the drain region 1b, and is commonly patterned in stripes or lattice on a surface of the substrate. The inner wall of the trench 5 is covered with a gate insulating film 6 of several hundreds Å according to the drive voltage.

The gate electrode 7 is formed by burying the trench 5 with polysilicon having a low resistivity with impurities. An upper portion of the gate electrode 7 is provided about several thousands Å below the opening of the trench 5, in other words, the surface of the channel layer 3. Moreover, because it is not necessary to design a source region 12 and a body region 13 using a design rule limit as described below, neighboring trenches 5 can be placed as close as possible so long as the region of the body region 13 is secured.

The source region 12 is provided by diffusing one conductivity type impurities so as to abut the trench 5. The source region 12 is formed on a surface of the substrate in the periphery of the trench 5 opening. Also, a portion of the source region 12 extends along side walls of the trench 5 in the depth direction of the trench 5 and reaches the depth of the gate electrode 7. The source region 12 is divided between neighboring trenches 5 by a recess 11.

The recess 11 is formed by etching a surface of the substrate between neighboring trenches 5 and the body region 13 formed by diffusing opposite conductivity type impurities is provided at a bottom portion thereof in order to stabilize substrate potential. The body region 13 is provided at a position lower than the surface of the channel layer 3 and is in contact with a source electrode 14.

An interlayer dielectric film 10 is completely filled in the trench 5. The upper end of the gate electrode 7 is positioned around several thousands Å below the surface of the channel layer 3 and the interlayer dielectric film 10 is entirely buried in the trench 5 between the top of the gate electrode 7 and the surface of the substrate so that, unlike conventional structures, there is no portion protruding from the surface of the substrate.

In more detail, the interlayer dielectric film 10 is formed by etching the entire surface without the use of any mask so that the film is thinner at its center than at its peripheral portion. In other words, the surface of the interlayer dielectric film 10 is a substantially planar with the surface of the substrate with the channel layer at the peripheral portion adjacent the opening of the trench 5 and is positioned lower than the surface of the substrate with the channel layer at its center.

The source electrode 14 is substantially planarly, i.e., without any significant step structure, formed on the gate electrode 7 and the interlayer dielectric film 10 and contacts the source region 12. Due to the fact that the interlayer dielectric film 10 is buried in the trench 5, there is almost no level difference on the interlayer dielectric film 10 so that the substantially planar source electrode 14 is provided. Also, a drain electrode (not illustrated here) can be formed on a rear surface of the substrate by a metal evaporation process.

Figure 15:
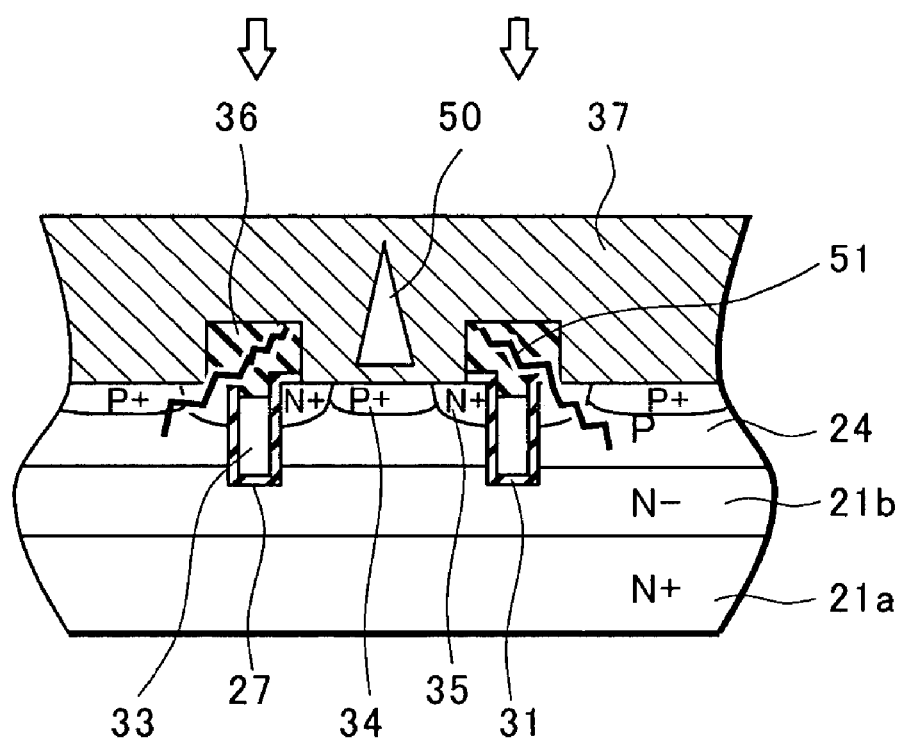
FIG. 15 is a cross sectional of the conventional semiconductor device manufactured based on the method of FIGS. 9-14 that includes a defect due to step coverage.

In the conventional device shown in FIG. 15, an interlayer dielectric film 36 protrudes about 8000 Å from the substrate surface, and the source electrode is sputtered over the large level difference, which results in the formation of the void 50 due to the step coverage. In addition, cracks 51 may be in the interlayer dielectric film 36 and a substrate 21 by stress concentration in the vicinity of the corner of the interlayer dielectric film 36 at the time of wire bonding according to the conventional manufacturing method.

However, in this embodiment, by burying the interlayer dielectric film 10 in the trench 5, the source electrode 14 contacts the source region 12 substantially planarly on the gate electrode 7, so that the occurrence of the voids 50 caused by a deterioration in step coverage and the cracks 51 generated at the time of wire bonding can be prevented, and reliability can be improved.

The source region 12 of this embodiment can contact the source electrode 14 at the surface of the channel layer 3 and on side walls of the recess 11. Due to cell size reduction, even if the area of the source region 14 exposed on the substrate surface is reduced, a sufficient contact area at the side walls of the recess 11 can be secured.

Moreover, in the conventional device, the distance between trenches is designed using a limit value of the line width regulation of three processes forming the source region 35, the body region 34 and the interlayer dielectric film 36. However, in th is embodiment, only one mask is necessary throughout the three processes for forming the source region 12, the body region 13 and the interlayer dielectric film 10. In other words, the distance between the trenches required to accommodate the mask placement error is just for one mask, and not three as in the conventional method.

Therefore, the distance between the trenches is reduced as much as possible, thus enabling expansion of the actual operation area. With this structure, on-resistance is reduced under an identical chip size, and chip size is reduced under an identical cell number.

Next, a method of manufacturing the N-channel trench type Power MOSFET of FIG. 1 is described with reference to FIG. 2 through FIG. 8B.

Figure 2:
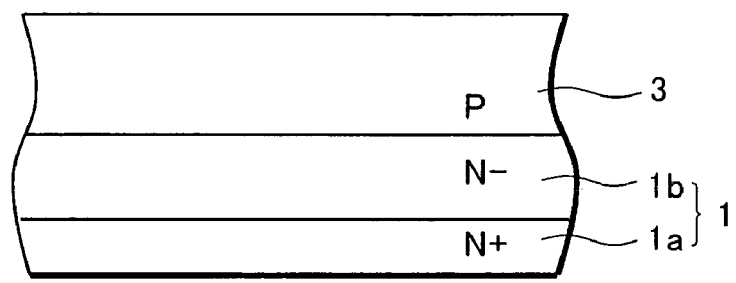
FIGS. 2-8B show device intermediates along processing steps of a method of manufacturing the semiconductor device of FIG. 1.

A first process of forming an opposite conductivity type channel layer on a surface of a one conductivity type semiconductor substrate is described hereinafter with reference to FIG. 2.

A substrate 1 is prepared by forming on an N$^+$-type silicon semiconductor substrate 1a an N$^-$-type epitaxial layer 1b which becomes a drain region. After an oxide film (not shown) is formed on a surface thereof, the oxide film covering a portion to become a channel layer 3 is etched to expose the surface of the substrate 1. The oxide film is used as a mask and a P-type channel layer 3 having a thickness of about 1.5 μm is formed by implanting boron (B), or the like, on the entire surface in a dose of $1.0 \times 10^{12 \sim 13}$ cm$^{-2}$ at an accelerated energy of around 50 KeV and diffusing the impurities.

Figure 3:
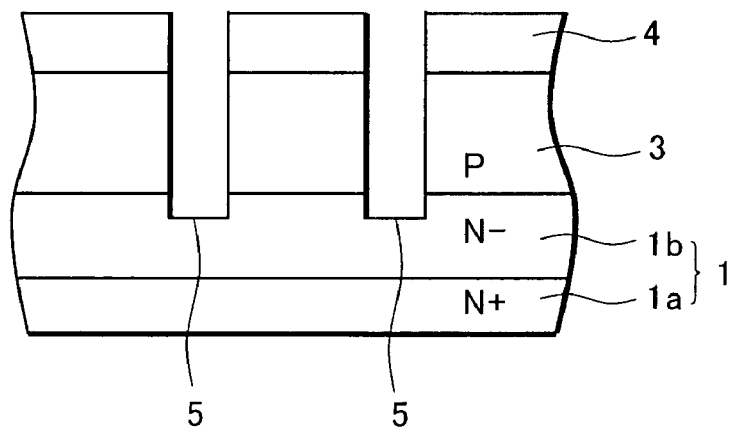

A second process of forming the trench penetrating the channel layer is next described with reference to FIG. 3. First, an NSG (Non-Doped Silicate Glass) CVD oxide film 4 having a thickness of 3000 Å is formed on the entire surface by the CVD method. Then, the CVD oxide film 4 is partly removed by dry etching using a mask made of a resist film to expose the channel region 3 and remove the resist film. By using the CVD oxide film 4 as a mask, the exposed substrate 1 is anisotropically dry etched by a CF or HBr group gas to form a trench 5 which penetrates the channel layer 3 and reaches the drain region 1b. The trench has a depth of around 2.0 μm and a width of around 0.5 μm.

Figure 4:
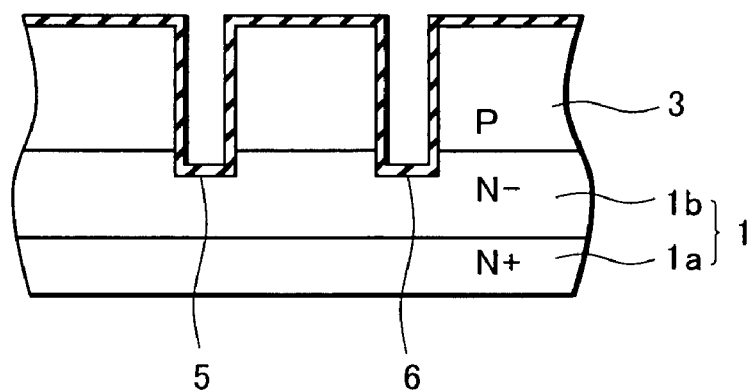

A third process of providing a gate insulating film on inner walls of the trench is next described with reference to FIG. 4. After dummy oxidation, an oxide film (not shown) is formed on inner walls of the trench 5 and on the surface of the channel layer 3. After removing the etching damages generated at the time of dry etching, the oxide film and the CVD oxide film 4 used as a trench etching mask are removed by etching. Further, a gate oxide film 6 having a thickness of, for instance, around 300 Å to 700Å, according to drive voltage, is formed by thermally oxidizing the entire surface.

Figure 5A:
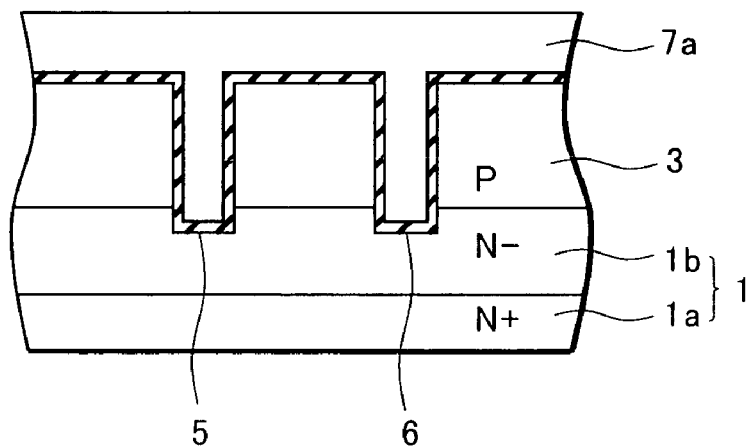
Figure 5B:
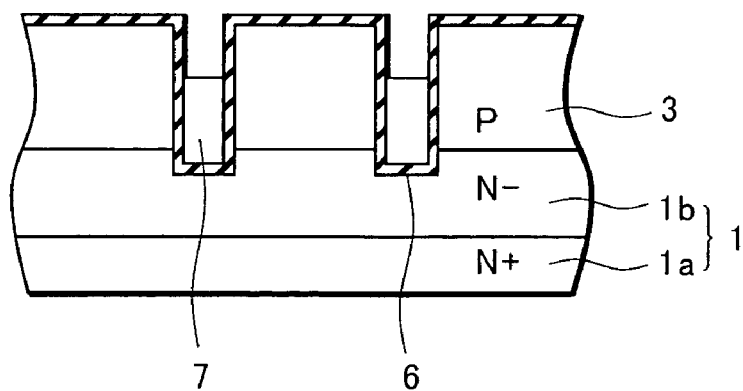

A fourth process of forming a gate electrode in the trench wherein an upper portion thereof is positioned lower than an opening of the trench is further described with reference to FIGS. 5A and 5B. A polysilicon layer 7a of high concentration impurities is provided to cover the entire surface. Or, a non-doped polysilicon layer is deposited on the entire surface, and then high concentration impurities are implanted and diffused to obtain a high specific conductivity (Refer to FIG. 5A). Next, the surface is dry etched without the use of any mask. During this process, over-etching is carried out until the upper portion of the polysilicon layer 7a is positioned below the opening of the trench 5 to form a gate electrode 7 buried in the trench 5. The upper portion of the gate electrode 7 is positioned around 8000 Å below the opening of the trench 5 to expose the gate oxide film 6 on side walls of the trench 5 in the vicinity of the opening of the trench 5 (Refer to FIG. 5B).

Figure 6A:
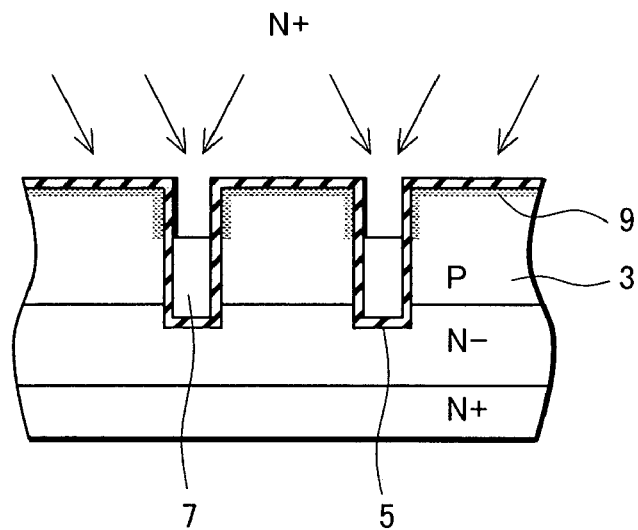

A fifth process of forming an interlayer dielectric film filled in the trench at the upper portion of the gate electrode, wherein the interlayer dielectric film is thinner in a vicinity of a center thereof than a peripheral portion thereof is further described with reference to FIG. 6. At first, a first conductivity type impurity region 9 is formed by N$^+$-type impurities which is arsenic(As) ion implantation, or the like, in doses of $5.0 \times 10^{15}$ cm$^{-2}$ obliquely in the entire surface in the surface of the channel layer 3 and on the exposed side walls of an upper part of the trench 5 (Refer to FIG. 6A).

Figure 6B:
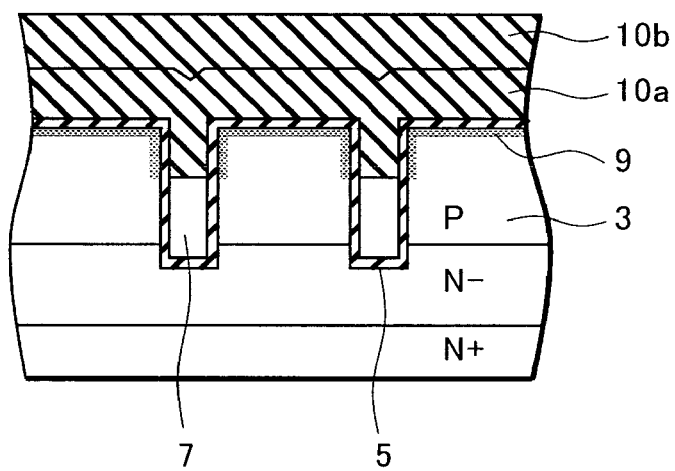
Figure 6C:
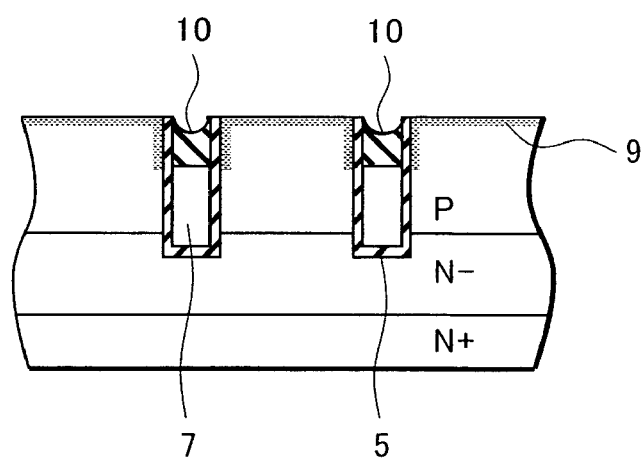

Further, a 2000 Å thick TEOS film (not shown here) is laminated on the entire surface, and after depositing a BPSG (Boron Phosphorus Silicate Glass) layer 10a having a thickness of around 6000 Å by the CVD method, an SOG (Spin on Glass) layer 10b is formed and a thermal treatment for planarization purposes is carried out (Refer to FIG. 6B).

Then, the entire surface is etched-back to expose the surface of the channel layer 3 and thus form an interlayer dielectric film 10 buried in the trench 5. Here, at the time of etchback, it is preferable to slightly over-etch in order to prevent film residue generation. The interlayer dielectric film 10 is etched by using end-point detection, until silicon of the channel layer 3 surface is exposed. A further process of over-etching the interlayer dielectric film 10 is next carried out. The interlayer dielectric film 10 is completely buried in the trench at the upper portion of the gate electrode 7 so that following formation of the interlayer dielectric film 10, the substrate surface becomes substantially planar because of the lack of protrusions thereon.

Here, over-etching causes formation of an interlayer dielectric film 10 which is thinner in a vicinity of a center thereof than a peripheral portion thereof. In other words, the peripheral part adjacent the trench 5 opening is substantially at the same level as the substrate surface, and the central portion thereof becomes lower than the peripheral portion thereof due to over-etching. With the structure according to this embodiment of the invention, the interlayer dielectric film 10 can be formed without using a mask (Refer to FIG. 6C).

A sixth process of forming a one conductivity type source region adjacent the trench and a body region positioned between neighboring source regions is further described with reference to FIG. 7 and FIG. 8.

Figure 7A:
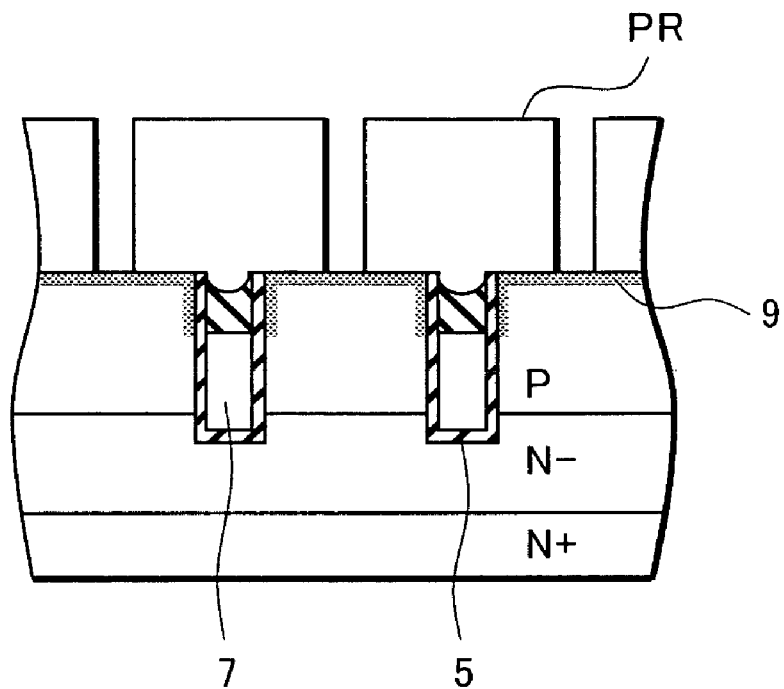
Figure 7B:
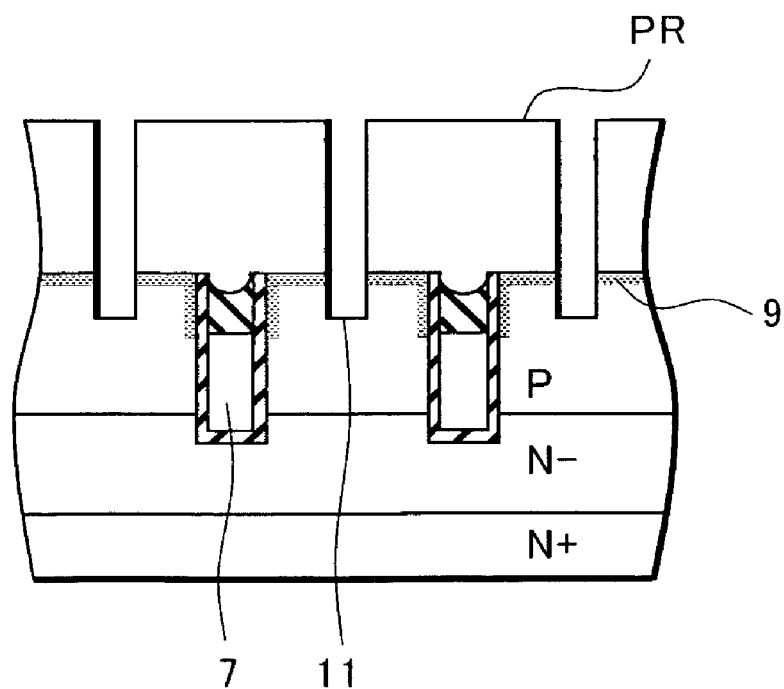

First, a mask is applied by a resist film PR in order to expose a surface of the channel layer 3 to form the body region between trenches (Refer to FIG. 7A). The exposed surface of the channel layer 3 is etched to form a recess 11 which divides the one conductivity type impurity region 9 provided between trenches 5 (Refer to FIG. 7B).

In this embodiment, arsenic is used as impurities of the one conductivity-type impurity region 9, the acceleration energy during implantation thereof is 140 KeV, ion implantation Rp (projected range distance) is 0.0791 μm, and the Δ Rp (standard deviation of the projected range distance) is 0.0275 μm. The etching depth at this step is about 0.11(=4 σ=4×0.0275) μm or larger.

At this process, the one conductivity type impurity region 9 is not subjected to diffusion by thermal treatment after ion implantation. Accordingly, it is possible to divide the one conductivity type impurity region 9 by the recess 11 as shallow as 0.20 μm. Because of this shallow recess, step coverage that could lead to defect formation is substantially eliminated.

The width of the opening of the recess 11, is for example, 0.20 μm. However, this width can be varied depending on the material of the source electrode to be sputtered in the surface.

Figure 8A:
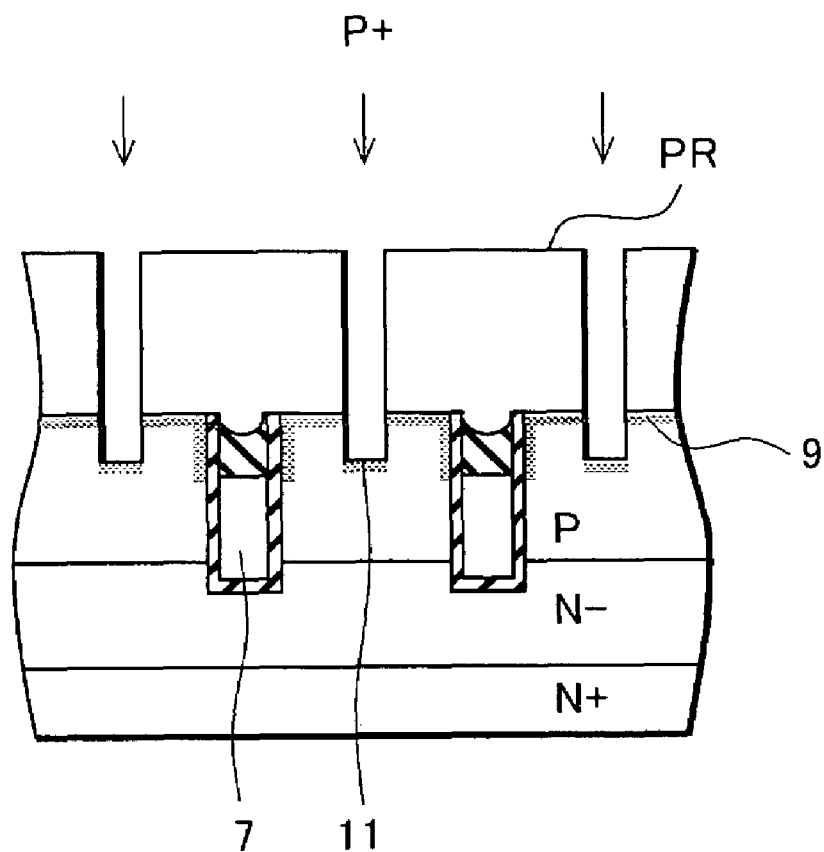
Figure 8B:
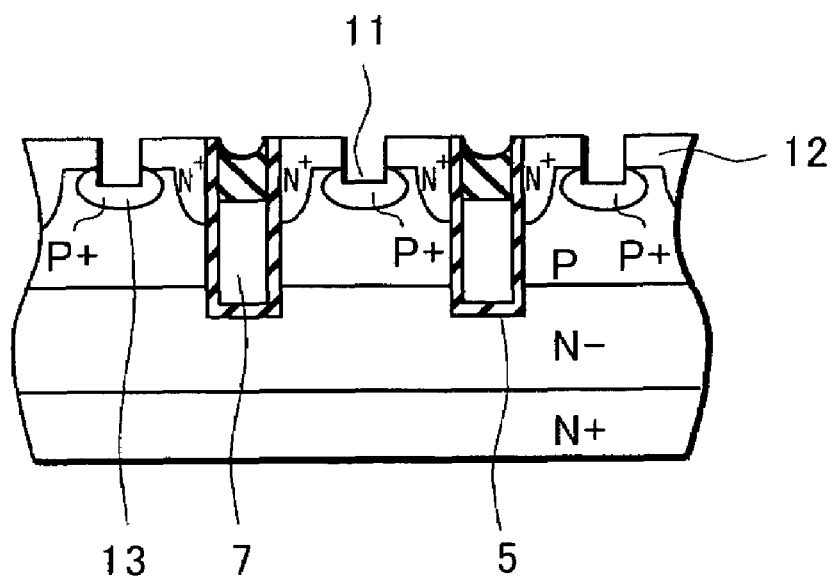
Figure 9:
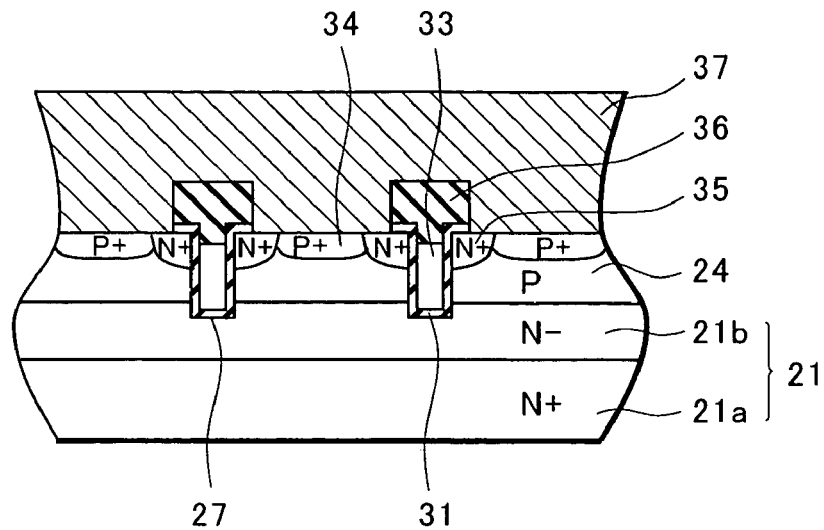
FIGS. 9-14 show device intermediates along processing steps of a conventional method of manufacturing an insulated gate type semiconductor device.
Figure 10:
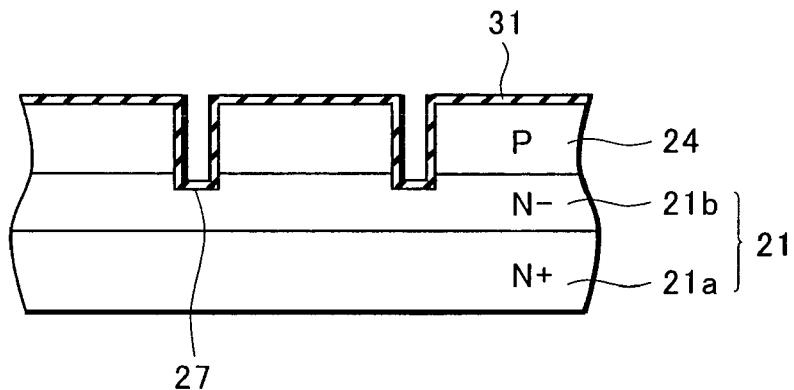
Figure 11:
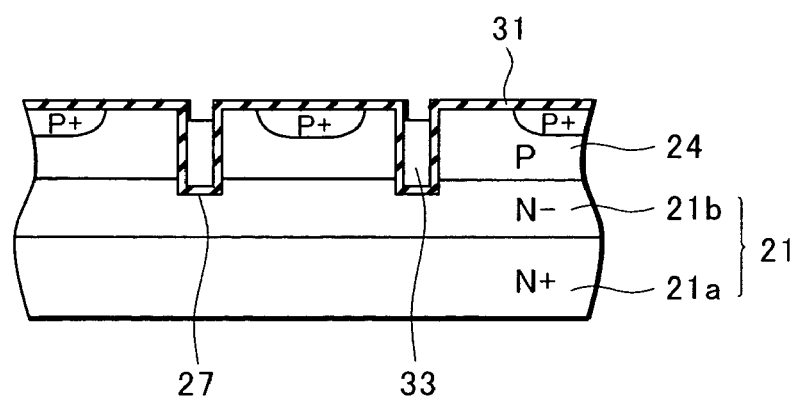
Figure 12:
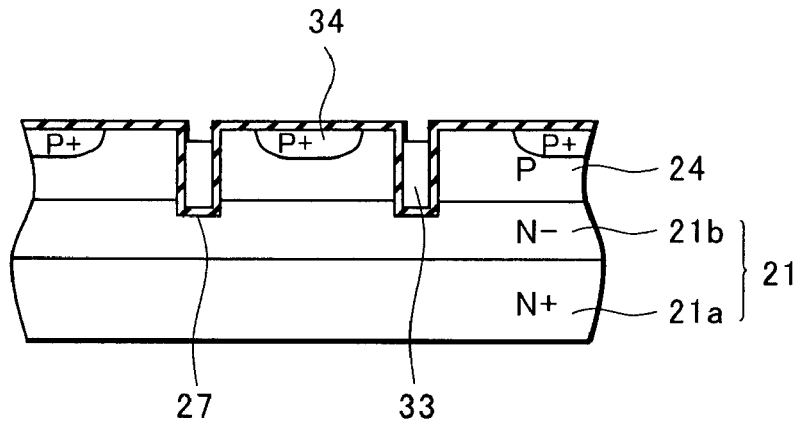
Figure 13:
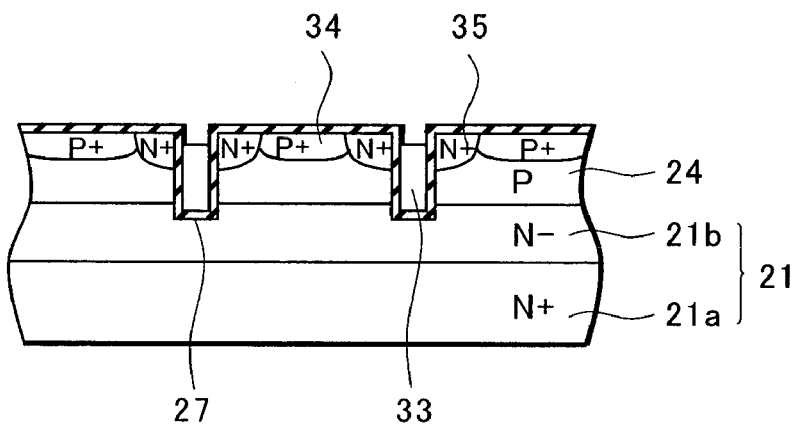
Figure 14:
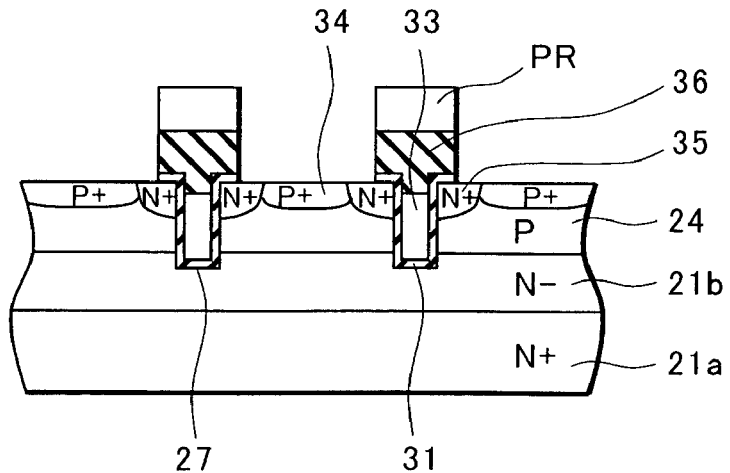

Boron, for instance, is ion implanted in the entire surface in a dose of about $5.0 \times 10^{14}$ cm$^{-2}$ and impurities are doped only on the bottom of the exposed recess 11, while maintaining the resist film PR used to form the recess 11 (Refer to FIG. 8A). After that, the resist film PR is removed and a thermal treatment is carried out.

With this process, impurities at the bottom of the recess 11 are diffused to thus form a P$^+$-type boron region 13 positioned lower than surface of the channel layer 3. The divided one conductivity type impurity region 9 is simultaneously diffused and as a result, source regions 12 adjacent respective trenches 5 are formed. A source region 12 is diffused in the surface of the channel layer 3 in the vicinity of the trench 5 opening and along side walls of the trench 5. As a result, the source region 12 reaches the depth of the gate electrode 7.

In this embodiment, in the process steps of forming the interlayer dielectric film 10, the source region 12 and the body region 13, only one mask is used. Conventionally, three masks are required to form these three device components. Accordingly, the method of this embodiment needs to accommodate placement error of only one mask, not three as in the conventional method, thus the chip size is reduced to its minimum as long as placement error of one mask is accounted for and the area of the body region is secured. Because of this size reduction, the total number of the cells in unit area increase, resulting in a reduced resistance.

A seventh process of forming the source electrode covering the gate electrode substantially planarly is further described with reference to FIG. 1. The source electrode 14 is formed contacting the source region 12 and the body region 13 by sputtering Al to the entire surface in a sputter apparatus. The interlayer dielectric film 10 is buried in the trench 5 in order to form the substantially planar source electrode 14, thus improving step coverage. Because the depth of the recess 11 is as small as 0.20 μm, the top surface of the source electrode 14 is substantially free from the effect of the level difference created by the recess and can be substantially flat.

The final structure as illustrated in FIG. 1 is obtained by forming a drain electrode by metal deposition on a rear surface of the substrate, which is omitted from drawings.

As described above, an N-channel type MOSFET is used in the embodiment, but a MOS transistor having an opposite conductivity type can be also used. This structure can be also applied to IGBTs which implement a bipolar transistor and a power MOSFET in one chip.

What is claimed is:

1. An insulated gate type semiconductor device comprising:
    a semiconductor substrate of a first conductivity type comprising a drain region;
    a channel layer of a second conductivity type formed on a surface of the drain region;
    a trench penetrating the channel layer to reach the drain region;
    a gate insulating film formed on an inner wall of the trench;
    a source region of the first conductivity type provided adjacent the trench;
    a gate electrode disposed in the trench;
    an interlayer dielectric film disposed in the trench so as to be on top of the gate electrode, the interlayer dielectric film being thinner at a center portion thereof than at a peripheral portion thereof so as to have a dent portion;
    a source electrode disposed over the trench so as to fill the dent portion of the interlayer dielectric film; and
    a body region of the second conductivity type that is in contact with the source electrode and is positioned lower than a surface of the channel layer,
    wherein the gate insulating film and the interlayer dielectric film do not extend beyond the trench, and
    the source region comprises an undercut dent portion, and part of the body region is disposed in the undercut dent portion.

2. The insulated gate type semiconductor device of claim 1, wherein a recess is formed in a surface of the channel layer between the trench and another trench.

3. The insulated gate type semiconductor device of claim 2, wherein the body region of the second conductivity type is disposed under the recess.

4. The insulated gate type semiconductor device of claim 3, wherein a side wall of the recess comprises part of the source region.

5. The insulated gate type semiconductor device of claim 2, wherein a side wall of the recess comprises part of the source region.

6. The insulated gate type semiconductor device of claim 1, wherein in a cross-sectional view of the semiconductor device a portion of the channel layer is disposed in the undercut dent portion of the source region so as to be between a sidewall of the source region and a lateral edge of the body region disposed in the undercut dent portion with respect to a direction parallel to the surface of the drain region.

7. The insulated gate type semiconductor device of claim 1, wherein a peripheral portion of the interlayer dielectric film is at the same level as the top surface of the source region.

* * * * *